United States Patent
Ziger

(10) Patent No.: US 6,566,016 B1
(45) Date of Patent: May 20, 2003

(54) APPARATUS AND METHOD FOR COMPENSATING CRITICAL DIMENSION DEVIATIONS ACROSS PHOTOMASK

(75) Inventor: David H. Ziger, San Antonio, TX (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 110 days.

(21) Appl. No.: 09/606,374

(22) Filed: Jun. 28, 2000

(51) Int. Cl.⁷ .................................................. G03F 9/00
(52) U.S. Cl. ............................................. 430/5; 430/30
(58) Field of Search ................................ 430/5, 22, 30

(56) References Cited

U.S. PATENT DOCUMENTS

| | | | | |
|---|---|---|---|---|
| 5,679,483 A | * | 10/1997 | Maurer | 430/5 |
| 6,174,630 B1 | * | 1/2001 | Petranovic et al. | 430/5 |
| 6,376,130 B1 | * | 4/2002 | Stanton | 430/5 |

* cited by examiner

Primary Examiner—Mark F. Huff
Assistant Examiner—Saleha R. Mohamedulla
(74) Attorney, Agent, or Firm—Peter Zawilski

(57) ABSTRACT

The present invention provides an apparatus and a method for compensating critical dimension deviations across a photomask. In this method, a photomask is partitioned into a plurality of regions. A critical dimension is then measured for each of the regions in the photomask. Based on the measured critical dimensions, a deviation map is generated to map deviation of the critical dimension from a target dimension for each of the regions in the photomask. From the deviation map, an amount of actinic radiation needed to be attenuated to compensate for the critical dimension deviation from the target dimension is determined for each of the regions of the photomask. Based on the determined attenuation amount of actinic radiation, the transmission of the actinic radiation through each of the regions in the photomask is attenuated such that the critical dimension deviation is compensated to the target dimension for each of the regions in the photomask.

23 Claims, 7 Drawing Sheets

*300*

| 1.21 302 | 1.23 304 | 1.23 306 | 1.22 308 | 1.21 310 |
|---|---|---|---|---|
| 1.22 312 | 1.25 314 | 1.24 316 | 1.23 318 | 1.22 320 |
| 1.22 322 | 1.26 324 | 1.25 326 | 1.23 328 | 1.22 330 |
| 1.22 332 | 1.23 334 | 1.23 336 | 1.22 338 | 1.21 340 |
| 1.21 342 | 1.22 344 | 1.22 346 | 1.21 348 | 1.21 350 |

C ↓ ... ↓ C' (top row)
B ↓ ... ↓ B' (middle row)

| 0.05 302 | 0.03 304 | 0.03 306 | 0.04 308 | 0.05 310 |
|---|---|---|---|---|
| 0.04 312 | 0.01 314 | 0.02 316 | 0.03 318 | 0.04 320 |
| 0.04 322 | 0 324 | 0.01 326 | 0.03 328 | 0.04 330 |
| 0.04 332 | 0.03 334 | 0.03 336 | 0.04 338 | 0.05 340 |
| 0.05 342 | 0.04 344 | 0.04 346 | 0.05 348 | 0.05 350 |

FIG. 4A

| 4.1 302 | 2.5 304 | 2.5 306 | 3.3 308 | 4.1 310 |
|---|---|---|---|---|
| 3.3 312 | 0.8 314 | 1.6 316 | 2.5 318 | 3.3 320 |
| 3.3 322 | 0.0 324 | 0.8 326 | 2.5 328 | 3.3 330 |
| 3.3 332 | 2.5 334 | 2.5 336 | 3.3 338 | 4.1 340 |
| 4.1 342 | 3.3 344 | 3.3 346 | 4.1 348 | 4.1 350 |

| 0 302 | 0.02 304 | 0.02 306 | 0.01 308 | 0 310 |
|---|---|---|---|---|
| 0.01 312 | 0.04 314 | 0.03 316 | 0.02 318 | 0.01 320 |
| 0.01 322 | 0.05 324 | 0.04 326 | 0.02 328 | 0.01 330 |
| 0.01 332 | 0.02 334 | 0.02 336 | 0.01 338 | 0 340 |
| 0 342 | 0.01 344 | 0.01 346 | 0 348 | 0 350 |

| 0.0 _302_ | 1.6 _304_ | 1.6 _306_ | 0.8 _308_ | 0.0 _310_ |
|---|---|---|---|---|
| 0.8 _312_ | 3.3 _314_ | 2.5 _316_ | 1.6 _318_ | 0.8 _320_ |
| 0.8 _322_ | 4.1 _324_ | 3.3 _326_ | 1.6 _328_ | 0.8 _330_ |
| 0.8 _332_ | 1.6 _334_ | 1.6 _336_ | 0.8 _338_ | 0.0 _340_ |
| 0.0 _342_ | 0.8 _344_ | 0.8 _346_ | 0.0 _348_ | 0.0 _350_ |

APPARATUS AND METHOD FOR COMPENSATING CRITICAL DIMENSION DEVIATIONS ACROSS PHOTOMASK

CROSS REFERENCE TO RELATED APPLICATION

The present application claims is related to U.S. patent application Ser. No. 09/606,376 filed on an even day herewith, entitled "Apparatus and Method for Forming Photoresist Pattern with Target Critical Dimension," by inventor David H. Ziger, assigned to the assignee of the present application, which is incorporated herein by reference.

BACKGROUND OF THE INVENTION

1. Field of the Invention

This invention relates generally to the field of semiconductor processing. More particularly, the present invention relates to forming photoresist patterns on an exposure field of a semiconductor wafer.

2. Description of the Related Art

The manufacturing of integrated circuit (IC) chips involves many processes. One of the major processes in manufacturing IC chips is photolithography. Photolithography is a process used to transfer masks containing patterns to the surface of a silicon wafer. In a photolithography process, patterns are transferred from a mask to a light sensitive material called photoresist using a light source to print the patterns onto the surface of the wafer. A chemical or plasma etching is then used to transfer the pattern from the photoresist to the surface of the wafer. Fabrication of IC chips may require a number of photolithography processes depending on the complexity of the circuits in the IC chips.

Today, the dimensions of IC components are becoming increasingly smaller. The smaller device dimensions allow more circuit devices to be provided in an IC chip. Accordingly, the precision and accuracy in performing various processes, and photolithography in particular, are critical in producing properly functioning semiconductor IC devices.

In the photolithography process, the printing of mask patterns onto a silicon wafer is typically performed using a projection aligner and stepper device. Conventional projection aligner and stepper device are described in detail in U.S. patent application Ser. No. 09/141,807, entitled "An Apparatus and Method for the Improvement of Illumination Uniformity in Photolithographic Systems, which is incorporated herein by reference. In using a stepper device, for example, an area in a semiconductor wafer exposed to the stepper device is commonly known as a exposure field. The stepper device "steps" over the fields of the surface of a wafer to print mask patterns.

Unfortunately, linewidths of mask patterns often vary across the mask due to nonuniformity in the mask fabrication process. Typically, critical dimensions of a mask are measured for a test feature that is replicated across the mask. Integrated circuit chip customers generally specify both a maximum deviation from a target and a deviation across the mask from the measured average. When used by a customer, the deviation across the mask typically causes linewidth variations across an exposure field, for example, of a stepper device. If a common exposure actinic radiation dose is used for forming a particular photoresist layer on the exposure field of a semiconductor wafer, the critical dimension deviation from a target critical dimension on the mask causes a systematic resist linewidth deviation in the photoresist layer. As can be appreciated, such variation in linewidths may result in IC chips that are either defective or do not perform to application specification.

In view of the foregoing, what is needed is an apparatus and a method for compensating critical dimension deviations across the photomask to improve the yield and performance of IC chips.

SUMMARY OF THE INVENTION

Broadly speaking, the present invention fills these needs by providing an apparatus and method for compensating critical dimension deviations across photomask. It should be appreciated that the present invention can be implemented in numerous ways, including as a process, an apparatus, a system, a device, or a method. Several inventive embodiments of the present invention are described below.

In one embodiment, the present invention provides an apparatus for forming a photoresist pattern on an exposure field of a semiconductor wafer. The apparatus includes a light source, a lens, a filter, and a photomask. The light source is adapted to generate actinic radiation for illuminating a photomask pattern onto the exposure field on the semiconductor wafer. The lens focuses the actinic radiation from the light source onto a filter. The filter filters the actinic radiation from the lens. The photomask has a substrate and a layer of reticle. The substrate of the photomask is transparent to the actinic radiation while the layer of reticle defines one or more photoresist patterns. The photomask is partitioned into a plurality of regions and is adapted to attenuate the actinic radiation from the lens in one or more regions to compensate for critical dimension deviations in the one or more regions from the target critical dimension. The plurality of regions in the filter transmits the actinic radiation from the filter to the photomask for illuminating the exposure field on the semiconductor wafer to form a photoresist pattern on the exposure field.

In another embodiment, the present invention provides a method of compensating for deviations in critical dimensions of photoresist patterns in a photomask. In this method, a photomask is partitioned into a plurality of regions. A critical dimension is then measured for each of the regions in the photomask. Based on the measured critical dimensions, a deviation map is generated to map deviation of the critical dimension from a target dimension for each of the regions in the photomask. From the deviation map, an amount of actinic radiation needed to be attenuated to compensate for the critical dimension deviation from the target dimension is determined for each of the regions of the photomask. Based on the determined attenuation amount of actinic radiation, the transmission of the actinic radiation through each of the regions in the photomask is attenuated such that the critical dimension deviation is compensated to the target dimension for each of the regions in the photomask.

In yet another embodiment, the present invention provides a method for forming a photomask to compensate for deviations in critical dimension of photoresist patterns on the photomask. The method includes: (a) partitioning a photomask into a plurality of regions where the photomask has a substrate transparent to an actinic radiation and a layer of reticle defines one or more photoresist patterns; (b) measuring a critical dimension for each of the regions in the photomask; (c) generating a deviation map indicating deviation of the critical dimension from a target dimension for each of the regions in the photomask; (c) determining an amount of actinic radiation needed to be attenuated to compensate for the critical dimension deviation from the target dimension in each of the regions of the photomask; and (d) adding one or more light attenuating materials to one or more regions of the photomask, wherein the light attenuating materials attenuate transmission of the actinic radiation through each of the regions in the photomask by the determined attenuation amount of actinic radiation such that the critical dimension deviation is compensated to the target dimension for each of the regions in the photomask.

In a preferred embodiment, the actinic radiation is attenuated through the regions in the photomask by implanting or depositing light attenuating materials. When used with a positive resist, the target critical dimension value is the highest critical dimension value selected from the critical dimension map. In this case, the implanted or deposited materials increase the critical dimension of the regions to the target critical dimension. On the other hand, when used with a negative resist, the target critical dimension value is the lowest critical dimension value selected from the critical dimension map. The implanting or deposition of the light attenuating materials, in this case, decreases the critical dimension of the regions to the target critical dimension value.

The implantation or deposition of light attenuating material to selected regions of the mask provides several advantages. For example, the apparatus and method of the present invention provides higher yield in manufacturing integrated circuit chips since the substantially uniform critical dimensions improve device performance and reduce failure. The implantation of light attenuating materials provides further advantages. For example, by implanting absorbing species rather than varying the thickness of the filter layer, the phase of the incoming light is not changed. Thus, the filter does not adversely affect lithography. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 3 shows an exemplary average CD map of an uncompensated mask in accordance with one embodiment of the present invention.

FIG. 4A illustrates an exemplary deviation map generated from the average critical dimension map for a positive resist in accordance with one embodiment of the present invention.

FIG. 4B shows an attenuation map generated from the deviation map using a positive resist in accordance with one embodiment of the present invention.

FIG. 5A shows a deviation map generated from the average critical dimension map for a negative resist in accordance with one embodiment of the present invention.

FIG. 5B shows an attenuation map of the mask generated from the deviation map for the negative resist in accordance with one embodiment of the present invention.

DETAILED DESCRIPTION OF THE PREFERRED EMBODIMENTS

An invention is described for an apparatus and method for compensating critical dimension deviations across photomask. It will be obvious, however, to one skilled in the art, that the present invention may be practiced without some or all of these specific details. In other instances, well known circuits, systems, and process operations have not been described in detail in order not to unnecessarily obscure the present invention.

Figure 1:
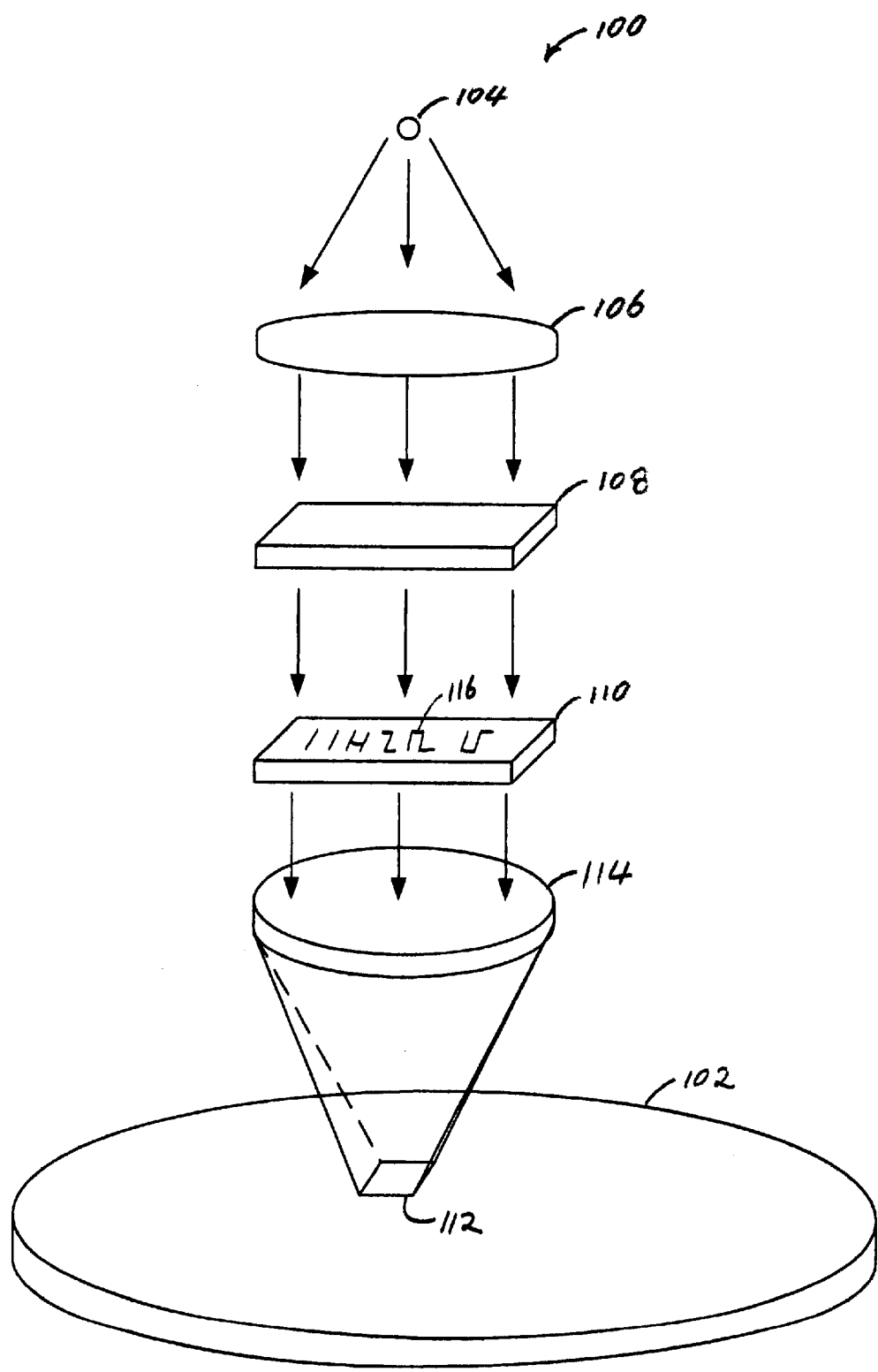
FIG. 1 illustrates an exemplary optical apparatus for forming a photoresist pattern on a semiconductor wafer in accordance with one embodiment of the present invention.

FIG. 1 illustrates an exemplary optical apparatus 100 for forming a photoresist pattern on a semiconductor wafer 102 in accordance with one embodiment of the present invention. In this apparatus 100, a light source 104 produces light in the form of actinic radiation for illuminating a mask pattern onto the wafer 102. For example, the light source 104 may generate actinic radiation such as Deep UV light or X-ray of varying wavelengths (e.g., 193 nm, 150 nm, 365 nm, 248 nm, etc.). The actinic radiation is adapted to induce photochemical activity in printing a photoresist material onto an exposure field on a semiconductor wafer.

The light from the light source 104 is directed to a condenser lens 106, which focuses the light and transmits the focused light to a filter 108. The filter 108 filters the light from the lens 106. The filtered light is then directed to a mask 110 that includes one or more patterns 116 to be transferred to an exposure field 112 on the wafer 102. As will be discussed in more detail below, the mask 110 is adapted to compensate for variations in critical dimensions across the mask.

In one embodiment, the mask 110 is implanted with absorbing species in one or more regions of the mask 110. The absorbing species and the semitransparent material are designed to modulate the light through the mask 110 so as to compensate for variations in linewidths. For example, the amount of absorbing species in the regions in the mask 110 may vary to absorb or attenuate light from the lens in different amounts.

In another embodiment, a semitransparent material of various thickness is deposited one or more regions on the mask 110. The deposition of transparent material is designed to modulate light exposure through the mask 110 to compensate for variations in critical dimension of the mask patterns. The implanting of absorbing species or deposition of semitransparent material thus has the effect of making the linewidths larger when used with a positive photoresist and smaller when used with a negative photoresist.

Typically, the size of the patterns 116 on the mask 110 is larger than the size of the patterns to be printed on the exposure field 112 by an integer multiple. For example, the size of the patterns 116 may be N times larger than the size of the actual patterns to be printed on the exposure field 112 where N is an integer greater than 1. To reduce the size of the patterns 116 to the desired size on the exposure field 112, the light from the filter 108 exposes or illuminates the patterns 116 in the mask 110 onto a field 112 (e.g., exposure field) on the wafer through a reduction lens 114. The reduction lens 114 thereby reduces the size of the patterns for printing on the exposure field 112 of the wafer 102.

The light exposure through the mask 110 thus allows the mask patterns 116 to be printed or formed on the field 112 in the wafer 102. The implantation of absorbing species and/or the deposition of semitransparent material in the mask 110 compensates for variations in linewidths across the mask 110. When exposed to the actinic radiation, the mask 110 minimizes variations in critical dimension linewidths of patterns formed in the field 112. After printing the patterns 116 onto the field 112, other fields on the wafer 102 or on other wafers may be exposed in a similar manner to form photoresist patterns.

Figure 2A:
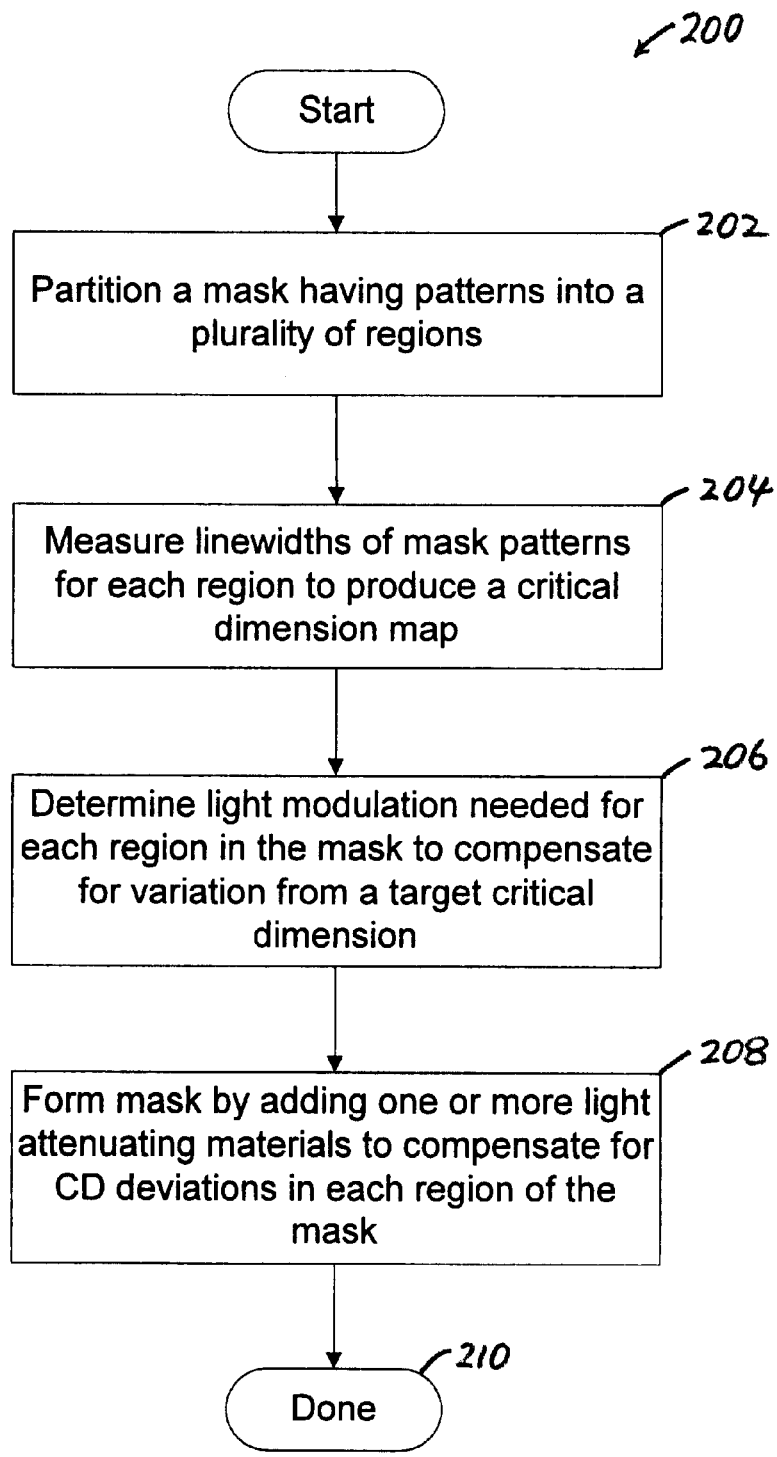
FIG. 2A shows a flowchart of a method for forming a mask that compensates for critical dimension variations in mask patterns in accordance with one embodiment of the present invention.

FIG. 2A shows a flowchart of a method 200 for forming the mask 110 that compensates for critical dimension variations in mask patterns in accordance with one embodiment of the present invention. In operation 202, a mask having patterns to be printed is partitioned into a plurality of regions. For example, the mask may be partitioned into N×M matrix of regions where N and M are integers greater than one. Preferably, N and M are equal such that the matrix is an N×N matrix.

After partitioning the mask into the regions, linewidths of mask patterns are measured to obtain an average CD value for each region in operation 204. The average CD values for the regions define an average CD map. Based on the CD values in the 10 regions, light modulation needed to compensate for the deviation from a target critical dimension is determined for each region in operation 206. By way of example, a proportionality constant α may be defined as the change in critical dimension per line width change, yielding a unit of energy per unit area per line width. Given a total light exposure dose E and required deviation correction C, the amount of light absorption A needed is defined as follows: $A=(\alpha*C)/E$. To increase the linewidth by 17 nm, for example, given E of 170 Joules/m$^2$ and α of 700 (J/m$^2$)/$\mu$m, requires 7% decrease in light exposure when using a positive resist.

Once the light modulation through the regions in the mask has been evaluated, the mask 110 is formed, in operation 208, by adding light attenuating materials to the regions of the mask to compensate for critical dimension deviations. Specifically, light transmission through each of the regions in the mask, which includes a substrate and photoresist patterns, is changed by adding one or more light attenuating materials to each of the regions. In one embodiment, a layer of semitransparent material that is stable to actinic radiation is deposited on the regions of the mask. For example, leaky chrome may be deposited on the regions of the mask that need light attenuation to increase linewidth dimension to the target dimension.

In another embodiment, regions of the mask that need to be modulated may be implanted with absorbing species. The absorbing species absorb actinic radiation to attenuate light transmission through the regions of the mask. Absorbing species such as boron, oxygen, sodium, or the like may be implanted in the substrate regions of the mask to increase linewidth dimension to the target dimension by attenuating light exposure. The addition of light attenuating materials to selected regions in the mask thus compensates for linewidth variations across the mask when used in printing mask patterns onto an exposure field in a wafer using the apparatus 100.

Figure 2B:
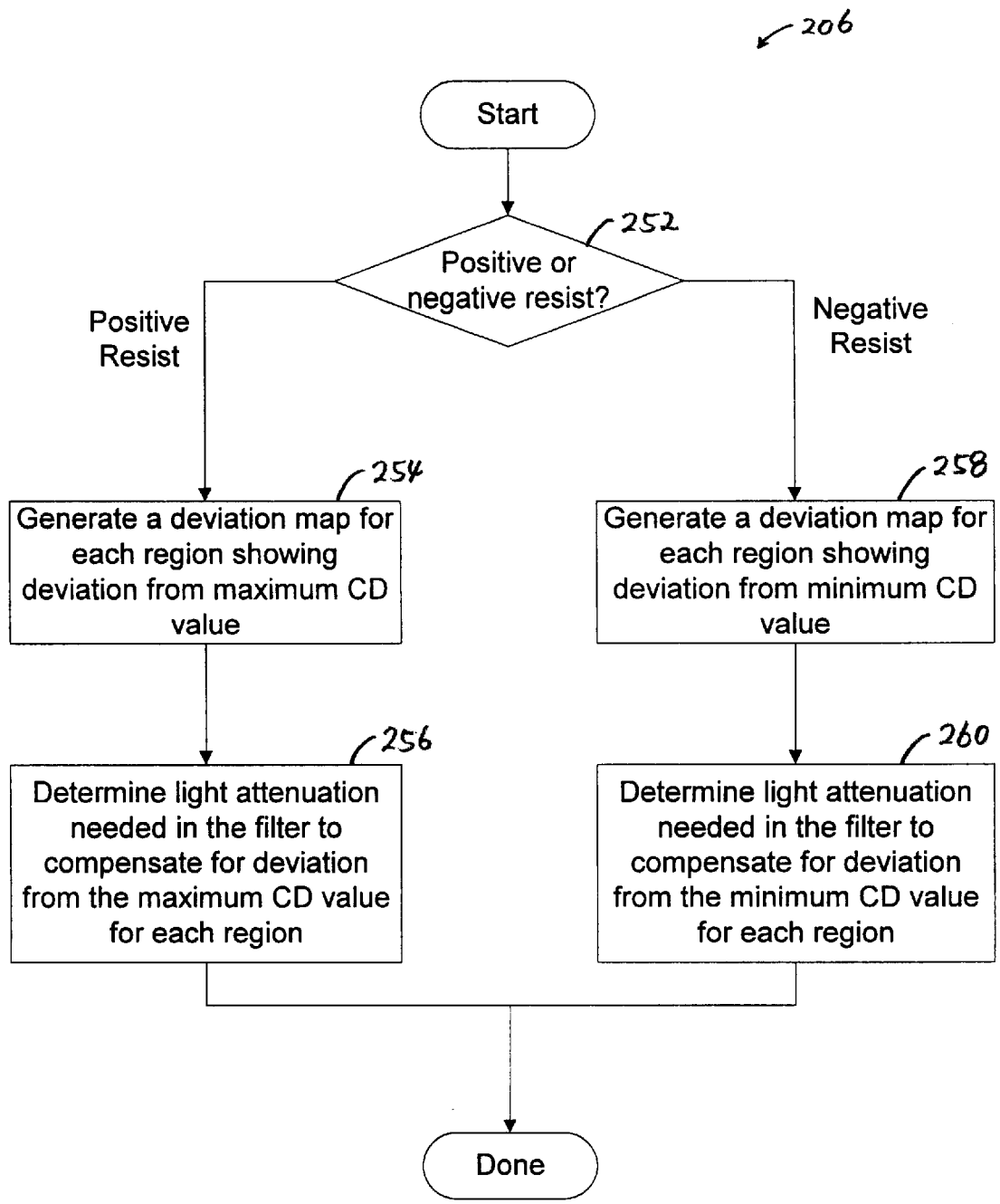
FIG. 2B shows a flowchart of a method for evaluating the amount of light modulation needed to compensate for CD variations in each region for either a positive or negative resist.

The present invention allows use of either a positive or negative resist for imprinting patterns onto an exposure field. For either type of resist, a deviation map and an attenuation map are created from the average critical dimension map. FIG. 2B shows a more detailed flowchart of the operation 206 for evaluating the amount of light modulation needed to compensate for CD variations in each region for either a positive or negative resist. In operation 252, it is determined whether the resist for forming the patterns 116 on the exposure field 112 is a positive or negative resist. If the resist is a positive resist, the amount of light needs to be attenuated in regions with critical dimensions smaller than the maximum CD value so as to increase the CD dimensions to that of the maximum CD value. In this case, a deviation map for the positive resist is generated by evaluating the difference between the maximum CD value and the local CD deviation value from the average critical dimension map. Then, the light attenuation needed in the mask to compensate for deviation from the maximum CD value is determined for each of the regions in the mask in operation 256.

On the other hand, if the resist is a negative resist, the amount of actinic radiation is attenuated in regions with features larger than the minimum CD value to decrease the CD dimensions to that of the minimum CD value. In this situation, a deviation map for the negative resist is generated by evaluating the difference between the local CD deviation value and the minimum CD value from the average critical dimension map as shown in operation 258. Then, the light attenuation needed in the mask to compensate for the deviation from the minimum CD value is determined for each of the regions in the mask in operation 260.

FIG. 3 shows an exemplary average CD map 300 of an uncompensated mask in accordance with one embodiment of the present invention. The mask is partitioned into twenty-five regions arranged to form a 5×5 matrix. The dimension of the mask is five times that of the actual dimension to be printed on an exposure field of a wafer. For example, a pattern on the mask having a dimension of 1.25$\mu$ will have a dimension of 0.25 $\mu$ when printed on a wafer. Accordingly, a target dimension of 0.25$\mu$ at the wafer level translates to a target dimension of 1.25$\mu$ at the mask level.

The CD map 300 of the uncompensated mask shows an average linewidth value for each of the regions 302 to 350. For example, regions 302, 304, 306, 308, and 310 are characterized by average linewidths of 1.21 $\mu$m, 1.23 $\mu$m, 1.23 $\mu$m, 1.22 $\mu$m, and 1.21 $\mu$m, respectively, while regions 322, 324, 326, 328, and 330 exhibit average linewidths of 1.22 $\mu$m, 1.26 $\mu$m, 1.25 $\mu$m, 1.23 $\mu$m, and 1.22 $\mu$m. In this linewidth map 300, the minimum linewidth is 1.21 $\mu$m in regions 302, 310, 342, 348, and 350 and the maximum linewidth is 1.26 $\mu$m in region 324.

FIG. 4A illustrates an exemplary deviation map 400 generated from the average critical dimension map 300 for a positive resist under operation 254 of FIG. 2B in accordance with one embodiment of the present invention. To determine a critical dimension deviation value for each of the regions, the highest average critical dimension is selected from the average CD map 300 as the maximum CD value. Then, the critical dimension deviation value for each region is evaluated by computing the difference between the maximum CD value and the local average CD value in the average CD map 300.

For example, in the average CD map 300, the highest CD value of 1.26 µm in region 324 is selected as the maximum critical dimension. Then, the difference between the maximum critical dimension and the average critical dimension for each region in the average critical dimension map 300 is computed to determine a critical dimension deviation to generate the deviation map 400. By way of example, regions 302, 304, 306, 308, and 310 show critical dimension deviations of 0.05 µm, 0.03 µm, 0.03 µm, 0.04 µm, and 0.05 µm, respectively, from the maximum critical dimension of 1.26 µm. The critical dimension deviation values for other regions in the map 400 are obtained in a similar manner.

After the critical dimension deviation map 500 has been generated, an attenuation map of the mask showing the light attenuation for each region is generated. FIG. 4B shows an attenuation map 450 generated under operation 256 of FIG. 2B using a positive resist in accordance with one embodiment of the present invention. For example, compensating for critical dimension deviation in region 322 to reach the target maximum critical dimension of 1.26 µm requires light attenuation that will increase the linewidth by 0.04 µm given a reduction ratio of 5. Using equation $A=(\alpha*C)/E$ discussed above and given E of 170 J/m$^2$ and $\alpha$ of 700 (Joules/m$^2$)/µm, the total amount of light exposure dosage required to increase the critical dimension of region 322 by 0.04 µm is given by ($\alpha*C$) or (0.04 µm)(700 Joules/m$^2$)µm), which is 28 Joules/m$^2$. The normalized light exposure doze (i.e., percentage of light attenuation or filtering) needed to increase the critical dimension by 0.04 µm is then obtained by 100%*($\alpha*C$)/(E * reduction ratio), which is (0.04 µm) (700 Joules/m$^2$)µm)/(170 Joules/m$^2$*5)*100% or 3.3% decrease in light exposure using a positive resist.

The amount of light attenuation for other regions in the attenuation map 550 is derived in similar manner. For example, the amounts of light exposure in regions 324, 326, 328, and 330 are attenuated by 0%, 0.8%, 2.5%, and 3.3%, respectively. It should be noted that the attenuation map 450 may be converted to a transmission map that indicates the amount of light to be transmitted by subtracting the amount of light attenuation from 100% for each of the regions in the map 450.

In accordance with another embodiment of the present invention, FIG. 5A shows a deviation map 500 generated from the average critical dimension map 300 for a negative resist under operation 258 of FIG. 2B. To determine a critical dimension deviation value for each of the regions, the lowest average critical dimension is selected from the average CD map 300 as the minimum CD value. Then, the critical dimension deviation value for each region is evaluated by computing the difference between the local average CD value in the average CD map 300 and the maximum CD value.

As shown in the average CD map 300, the lowest CD value of 1.21 µm in region 302, for example, may be selected as the minimum critical dimension. Then, the difference between the average critical dimension for each region in the average critical dimension map 300 and the minimum critical dimension is computed to determine a critical dimension deviation to generate the deviation map 500. By way of example, regions 302, 304, 306, 308, and 310 show critical dimension deviations of 0 µm, 0.02 µm, 0.02 µm, 0.01 µm, and 0 µm, respectively, from the minimum critical dimension of 1.21 µm. The critical dimension deviation values for other regions in the map 500 can be obtained in a similar manner.

After obtaining the critical dimension deviation map 500, an attenuation map of the mask showing the light attenuation for each region is generated. FIG. 5B shows an attenuation map 550 of the mask generated under operation 260 of FIG. 2B using equation $A=(\alpha*C)/E$ discussed above, given E of 170 J/m$^2$ and $\alpha$ of 700 (Joules/m$^2$)/µm in accordance with one embodiment of the present invention. By way of example, compensating for critical dimension deviation in region 304 to reach the target minimum critical dimension of 1.21 µm requires light attenuation that will decrease the linewidths by 0.02 µm. The total amount of light exposure dosage required to decrease the critical dimension of region 310 by 0.02 µm is given by ($\alpha*C$) or (0.02 µm)(700 Joules/m$^2$)/µm), which is 14 Joules/m$^2$. Given a reduction ratio of 5, the normalized light exposure doze (i.e., percentage of light attenuation or filtering) needed to decrease the critical dimension by 0.02 µm is then obtained by 100%* ($\alpha*C$)/(E*reduction ratio), which is (0.02 µm)(700 Joules/m$^2$)/µm)/(170 Joules/m$^2$*5)*100% or 1.6% decrease in light exposure using a negative resist.

The amount of light attenuation for other regions in the attenuation map 550 is derived in a similar manner. The amounts of light exposure in regions 302, 306, 308, and 310, for example, are attenuated by 0%, 1.6%, 0.8%, and 0%, respectively. The attenuation map 550 of the mask may also be converted to a transmission map that indicates the amount of light to be transmitted by subtracting the amount of light attenuation from 100% for each of the regions in the map 550.

The critical dimension deviation maps 400 and 500 thus indicate the amount of critical dimension to be corrected for each of the regions. When using a positive resist, regions with the maximum CD values are not compensated while other regions less than the maximum CD values are compensated by implanting or depositing absorbing species in the associated regions in the mask. On the other hand, regions with the minimum CD values are not compensated when using a negative resist while other regions, are compensated by implanting or depositing light absorbing species in the mask.

In one embodiment, the light attenuation maps 550 and 650 are used to selectively implant the mask with dopant species. The dopant species are implanted in the filter to absorb actinic radiation to increase or decrease the critical dimension linewidths of regions depending on whether the resist is a positive or negative resist. For example, the mask is implanted with dopant species to adjust absorption of actinic radiation.

Figure 6A:
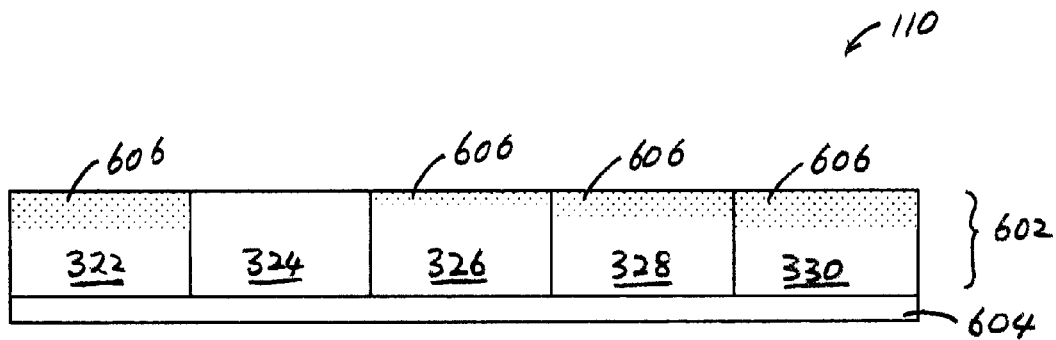
FIG. 6A shows a cross sectional view of the mask adapted to compensate for linewidth variations for use with a positive resist in accordance with one embodiment of the present invention.

FIG. 6A shows a cross sectional view of the mask 110 adapted to compensate for linewidth variations for use with a positive resist in accordance with one embodiment of the present invention. In this view, the cross sectional view of the mask 110 is taken along a line defined by B and B' of FIG. 3 and thus shows regions 322 to 330 of the mask 110. The mask 110 is made of a substrate 602 that is transparent to actinic radiation such as glass, quartz, transparent plastic, fused silica, calcium fluoride, etc. A layer of reticle 604 containing photoresist patterns 116 to be printed is formed on the substrate 602.

To increase the linewidths to that of the highest or target deviation value, the substrate 602 is implanted with dopant species 606 in regions 322, 326, 328, and 330 to absorb actinic radiation. For example, light absorbing species 606 such as boron, oxygen, sodium, or the like may be implanted in the substrate 602 to absorb actinic radiation of various wavelengths (e.g., 150 nm, 152 nm, 193 nm, 248 nm, and 365 nm). The implantation of absorbing species may be performed, for example, by ion bombardment, chemical vapor deposition, etc. A quartz substrate implanted with boron, for example, will absorb 248 nm actinic radiation (e.g., DUV) compared to undoped quartz.

Since regions 322 and 330 need to be compensated for 0.04 μm while regions 326 and 328 require corrections of 0.01 μ and 0.03 μm, more dopant species 606 is implanted in regions 322 and 330 than in regions 326 and 328. Likewise, more dopant species is implanted in region 328 than in region 326. It is noted that if the dimension of a region matches the target dimension as in region 324, no light attenuating material is added to that region. Other regions in the mask may be implanted with absorbing species in a similar manner to increase the linewidth to match the target dimension.

Figure 6B:
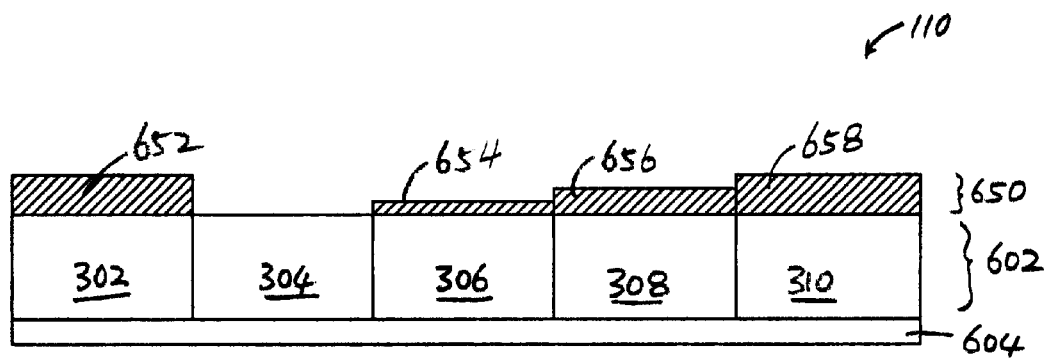
FIG. 6B shows a cross sectional view of the mask adapted to compensate for linewidth variations when using a positive resist in accordance with one embodiment of the present invention.

In another embodiment, a layer of light attenuating material is deposited on a mask to selectively adjust light transmission through the regions of the mask 110. FIG. 6B shows a cross sectional view of the mask 110 adapted to compensate for linewidth variations when using a positive resist in accordance with one embodiment of the present invention. In this view, the cross sectional view of the mask 110 is taken along a line defined by C and C' of FIG. 3 and thus shows regions 302 to 310 in the mask 110.

To increase the linewidths to that of the highest or target deviation value, a layer 650 of light attenuating material is selectively deposited on the regions 302 to 310 of the mask 110 to attenuate actinic radiation through the regions. For example, light attenuating material that is stable to the actinic radiation and is relatively easy to deposit such as leaky chrome is deposited on regions 302, 306, 308, and 310 of substrate 602 to attenuate actinic radiation of various wavelengths (e.g., 150 nm, 152 nm, 193 nm, 248 nm, and 365 nm). More light attenuating material is deposited in regions that require more light attenuation. For instance, since region 302 needs to compensate for 0.05 μ while region 306 requires a correction of 0.03 μ, a thicker layer 452 of light attenuating material is deposited on region 302 than on region 306. It is noted that where the dimension of a region matches the target dimension as in region 304, no light attenuating material is deposited on that region. Other regions may be deposited with absorbing species in a similar manner to increase the linewidth to match the target dimension.

In some embodiments, a target CD value may be set instead of using the maximum or minimum critical dimension value. In this case, regions in the filter 108 with deviation values less than the target CD value are implanted or deposited with absorbing species to increase the critical dimension to the target value when using the positive resist. Likewise, when using a negative resist, regions in the filter 108 with critical dimension values greater than the target value are implanted or deposited with absorbing species to decrease the critical dimension to the target value.

The implanting or deposition of light attenuation or light absorbing materials is designed to decrease the amount of light transmitted to the exposure field on a wafer. The decrease in exposure dose has the effect of increasing the linewidths in regions of an exposure field according to the amount of material added in the regions. With regions of exposure field thus implanted with light absorbing species, the mask 110 compensates for linewidth variations and allows formation of regions in an exposure field with substantially uniform linewidths.

The implantation or deposition of light attenuating material to selected regions of the mask 110 provides several advantages. For example, the apparatus and method of the present invention provides higher yield in manufacturing integrated circuit chips since the substantially uniform critical dimensions improve device performance and reduce failure. The implantation of light absorbing species provides further advantages. For example, by implanting absorbing species rather than varying the thickness of the filter layer, the phase of the incoming light is not changed. Thus, the filter does not adversely affect lithography. In addition, the filter can be constructed without lithography by scanning the filter under an implant beam at different exposure dosage to impart varying doses of implanted species.

While the present invention has been described in terms of several preferred embodiments, there are alterations, permutations, and equivalents which fall within the scope of this invention. It should also be noted that there are alternative ways of implementing both the method, device, and system of the present invention. It is therefore intended that the following appended claims be interpreted as including all such alterations, permutations, and equivalents as fall within the true spirit and scope of the present invention.

What is claimed is:

1. A method of compensating for deviations in critical dimensions of photoresist patterns in a photomask, comprising:

partitioning a photomask into a plurality of regions;

measuring a critical dimension for each of the regions in the photomask;

generating a deviation map indicating deviation of the critical dimension from a target dimension for each of the regions in the photomask;

determining an amount of actinic radiation needed to be attenuated to compensate for the critical dimension deviation from the target dimension in each of the regions of the photomask;

attenuating transmission of the actinic radiation through each of the regions in the photomask by the determined attenuation amount of actinic radiation such that the critical dimension deviation is compensated to the target dimension for each of the regions in the photomask.

2. The method as recited in claim wherein 1, the photomask comprises:

a substrate transparent to the actinic radiation; and a layer of reticle defining one or more photoresist patterns.

3. The method as recited in claim 2, wherein the transmission of actinic radiation is attenuated by implanting a dopant species in one or more regions of the substrate, wherein the dopant species is adapted to decrease transmission of the actinic radiation through the one or more regions.

4. The method as recited in claim 2, wherein the actinic radiation is attenuated by depositing a layer of semitransparent material in one or more regions of the substrate to attenuate transmission of the actinic radiation through one or more regions in the photomask.

5. The method as recited in claim 3, wherein the dopant species is implanted in the one or more regions that have critical dimensions less than the target dimension and wherein the dopant species is adapted to absorb an actinic radiation from a light source to increase the critical dimension of the one or more regions.

6. The method as recited in claim 1, wherein the actinic radiation is adapted to induce photochemical activity for forming the photoresist patterns on an exposure field of a semiconductor wafer.

7. The method as recited in claim 3, wherein the dopant species is a chemical selected from the group consisting of boron, oxygen, and sodium.

8. The method as recited in claim 4, wherein the semi-transparent material is leaky chrome.

9. The method as recited in claim 2, wherein the transparent substrate is formed of a material selected from the group consisting of glass, transparent plastic, quartz, fused silica, and calcium fluoride.

10. The method as recited in claim 1, wherein the critical dimension is a line width of the photoresist pattern.

11. The method as recited in claim 1, wherein the actinic radiation is a deep ultraviolet light or X-ray.

12. The method as recited in claim 1, wherein the plurality of regions is an N×N matrix where N is an integer greater than one.

13. A method for forming a photomask to compensate for deviations in critical dimensions of photoresist patterns on the photomask, comprising:

partitioning a photomask into a plurality of regions, the photomask having a substrate transparent to an actinic radiation and a layer of reticle defining one or more photoresist patterns;

measuring a critical dimension for each of the regions in the photomask;

generating a deviation map indicating deviation of the critical dimension from a target dimension for each of the regions in the photomask;

determining an amount of actinic radiation to be attenuated to compensate for the critical dimension deviation from the target dimension in each of the regions of the photomask;

adding one or more light attenuating materials to one or more regions of the photomask, wherein the light attenuating materials attenuate transmission of the actinic radiation through each of the regions in the photomask by the determined attenuation amount of actinic radiation such that the critical dimension deviation is compensated to the target dimension for each of the regions in the photomask.

14. The method as recited in claim 13, wherein the transmission of actinic radiation is attenuated by implanting a dopant species in one or more regions of the substrate, wherein the dopant species is adapted to decrease transmission of the actinic radiation through the one or more regions.

15. The method as recited in claim 13, wherein the actinic radiation is attenuated by depositing a layer of semitransparent material in one or more regions of the substrate to attenuate transmission of the actinic radiation through the one or more regions in the photomask.

16. The method as recited in claims 14, wherein the dopant species is implanted in the one or more region that have critical dimensions less than the target dimension and wherein the dopant species is adapted to absorb an actinic radiation from a light source to increase the critical dimension of the one or more regions.

17. The method as recited in claim 13, wherein the actinic radiation is adapted to induce photochemical activity for forming the photoresist patterns on an exposure field of a semiconductor wafer.

18. The method as recited in claim 14, wherein the dopant species is a chemical selected from the group consisting of boron, oxygen, and sodium.

19. The method as recited in claim 15, wherein the semitransparent material is leaky chrome.

20. The method as recited in claim 13, wherein the substrate is formed of a material selected from the group consisting of glass, transparent plastic, quartz, fused silica, and calcium fluoride.

21. The method as recited in claim 13, wherein the critical dimension is a line width of the photoresist pattern.

22. The method as recited in claim 13, wherein the actinic radiation is a deep ultraviolet light or X-ray.

23. The method as recited in claim 13, wherein the plurality of regions is an N×N matrix where N is an integer greater than one.

* * * * *